(12) United States Patent
Koshizuka

(10) Patent No.: US 8,593,893 B2
(45) Date of Patent: Nov. 26, 2013

(54) SEMICONDUCTOR MEMORY DEVICE AND READ WAIT TIME ADJUSTMENT METHOD THEREOF, MEMORY SYSTEM, AND SEMICONDUCTOR DEVICE

(71) Applicant: Elpida Memory, Inc., Tokyo (JP)

(72) Inventor: Atsuo Koshizuka, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 0 days.

(21) Appl. No.: 13/748,466

(22) Filed: Jan. 23, 2013

(65) Prior Publication Data

US 2013/0135950 A1 May 30, 2013

Related U.S. Application Data

(63) Continuation of application No. 13/137,928, filed on Sep. 21, 2011, now Pat. No. 8,391,090, which is a continuation of application No. 12/656,061, filed on Jan. 14, 2010, now Pat. No. 8,054,700.

(30) Foreign Application Priority Data

Jan. 16, 2009 (JP) .................................. 2009-007829

(51) Int. Cl.
*G11C 7/00* (2006.01)

(52) U.S. Cl.
USPC .................... 365/193; 365/231.1; 365/230.06

(58) Field of Classification Search
USPC .................. 365/193, 231.1, 230.06
See application file for complete search history.

(56) References Cited

U.S. PATENT DOCUMENTS

| | | | |
|---|---|---|---|
| 5,815,462 A | 9/1998 | Konishi et al. | |
| 6,031,770 A | 2/2000 | Pawlowski | |
| 6,064,625 A * | 5/2000 | Tomita | 365/233.11 |
| 6,166,990 A | 12/2000 | Ooishi et al. | |
| 6,330,200 B2 | 12/2001 | Ooichi | |
| 6,414,530 B2 * | 7/2002 | Noda et al. | 327/269 |
| 6,985,401 B2 | 1/2006 | Jang et al. | |
| 7,239,576 B2 * | 7/2007 | Shimbayashi | 365/233.5 |

(Continued)

FOREIGN PATENT DOCUMENTS

JP 2005-332548 12/2005

OTHER PUBLICATIONS

JEDEC Standard DDR3 SDRAM Specification JESD79-3B, Apr. 2008, JEDEC Solid State Technology Association (JEDEC Solid Technology Association) pp. 37-41.

*Primary Examiner* — Tuan T. Nguyen

(74) *Attorney, Agent, or Firm* — McGinn IP Law Group, PLLC

(57) ABSTRACT

A controller includes a set of first terminals to be coupled to a device that is under control of the controller, and a control circuit configured to generate and output onto the set of first terminals edge specifying information that takes a selected one of first and second states, the edge specifying information being supplied to the device to cause the device to activate a data strobe signal at a first timing when the selected one of the edge specifying information is the first state and at a second timing, that is different from the first timing, when the edge specifying information is the second state, the control circuit being further configured to generate and output onto the set of first terminals a read command, the read command being supplied to the device to cause the device to return to the controller a data signal.

17 Claims, 6 Drawing Sheets

(56) References Cited

U.S. PATENT DOCUMENTS

| | | | |
|---|---|---|---|
| 7,245,552 B2 * | 7/2007 | Freebern | 365/189.14 |
| 7,372,745 B2 | 5/2008 | Kitamura | |
| 7,940,096 B2 | 5/2011 | Ku | |
| 8,248,868 B2 * | 8/2012 | Nobunaga et al. | 365/189.14 |
| 2004/0022088 A1 | 2/2004 | Schaefer | |
| 2006/0291323 A1 | 12/2006 | Freebern | |
| 2011/0182128 A1 | 7/2011 | Nobunaga et al. | |
| 2012/0081981 A1 | 4/2012 | Oh | |

* cited by examiner

SEMICONDUCTOR MEMORY DEVICE AND READ WAIT TIME ADJUSTMENT METHOD THEREOF, MEMORY SYSTEM, AND SEMICONDUCTOR DEVICE

REFERENCE TO RELATED APPLICATION

The present application is a Continuation Application of U.S. patent application Ser. No. 13/137,928, filed on Sep. 21, 2011, which is a Continuation Application of U.S. patent application Ser. No. 12/656,061, now U.S. Pat. No. 8,054, 700, which is based on and claims priority from Japanese Patent Application No. 2009-007829, filed on Jan. 16, 2009, the entire contents of which is incorporated herein by reference.

TECHNICAL FIELD

This application is based upon and claims the benefit of the priority of Japanese patent application No. 2009-007829, filed on Jan. 16, 2009, the disclosure of which is incorporated herein in its entirety by reference thereto.

The present invention relates to a semiconductor memory device and a read wait time adjustment method thereof, a memory system, and a semiconductor device. More specifically, the invention relates to an operation when a synchronous circuit such as a PLL or a DLL is not used in a semiconductor memory device or a semiconductor device that operates in synchronization with a system clock.

BACKGROUND

There have been remarkable increases in capacity and speed of semiconductor memory devices including a dynamic RAM. In a DDR SDRAM (Double Data Rate Synchronous DRAM) in particular, internal operations are pipelined, and commands that have been supplied from an outside in synchronization with a clock are sequentially executed. Together with the sequential execution of the commands, it is arranged that data transfer is performed at a rate twice as the frequency of the clock, thereby implementing a high-speed system operation. In the DDR SDRAM or the like, a DLL (Delay Locked Loop) circuit is employed. Then, an internal circuit is operated in synchronization with the clock supplied from the outside. A high-speed data transfer is thereby implemented. Patent Document 1, for example, describes a memory device in which a skew between a system clock supplied from an outside and a data strobe terminal (DQS terminal) or a data terminal (DQ terminal) is minimized, using a DLL.

On the other hand, reduction in power consumption of a semiconductor memory device has been demanded in a server or the like as well as a notebook PC that operates on a battery. However, since the DLL must cause the clock to be constantly operated at a high speed, this high speed of the clock may lead to an increase in power consumption. On contrast therewith, page 37 of Non-patent Document 1 describes that provision of a DLL-off mode by which the DLL is turned off is specified in a DDR3 SDRAM. The DDR3 SDRAM is the latest DDR SDRAM standard.

The DLL-off mode specified in this Non-patent Document 1 will be described. FIG. 1 is a timing diagram about a DLL-on mode and the DLL-off mode in the DDR3 SDRAM. Referring to FIG. 1, "CK" denotes a system clock signal that is supplied to a CK terminal of the DDR3 SDRAM from a memory controller, "/CK" is an inverted signal of the "CK" signal, which is supplied to a "/CK terminal". FIG. 1 shows the CK signal by a solid line and the /CK signal by a broken line. "Command" denotes a command that is supplied to the DDR3 SDRAM from the memory controller, and "Bank Add" and "Col Add" respectively denote a bank address and a column address when the command is supplied to the DDR3 SDRAM. Data output from a DQ terminal (data terminal) of the DDR3 SDRAM, data strobe signals output from a DQS terminal (data strobe terminal) and a /DQS terminal (inverted data strobe terminal) of the DDR3 SDRAM at a time of receiving a read command are respectively indicated as "DQ", "DQS", and "/DQS". The data strobe signal DQS is indicated by a solid line, while the data strobe signal /DQS is indicated by a broken line. FIG. 1 shows the DQ signal and the DQS signal that are output from the DDR3 SDRAM at a time of receiving the read command when the DDR3 SDRAM is set to a DLL-on mode and when the DDR3 SDRAM is set to the DLL-off mode. A CAS latency CL is set to six, while an additive latency (Additive Latency) AL is set to 0.

Referring to FIG. 1, the read command is supplied to the DDR3 SDRAM at a rising edge at a timing T0. As described above, the CAS latency is six, and the additive latency is zero in the DLL-on mode. Thus, the DQS terminal outputs a low level for a certain period of time as a read preamble, in advance. Then, the DQS signal rises in synchronization with a rise of a sixth clock of the system clock at a timing T6. Then, the DQS signal repeats a toggling operation in synchronization with the system clock until a burst output is completed. During that period, the data are output from the DQ terminal, in synchronization with a rise and a fall of the DQS terminal. In the case of the DLL-on mode, the DQS signal output from the DDR SDRAM is synchronized with the system clock signal CK and the /CK signal supplied from the memory controller and a DLL circuit. Thus, a phase deviation is small.

On the other hand, in the DLL-off mode, an internal clock generated inside the DDR SDRAM from the system clock supplied from the memory controller is not phase adjusted with the system clock signal. Thus, the phase of the DQS signal generated from the internal clock is also deviated from the system clock. The magnitude of the deviation depends on the magnitude of a delay time of circuits inside the DDR SDRAM. The standard of the DDR3 SDRAM described in Non-patent Document 1 defines that the clock latency is fixed at six, and the DQS signal starts to be output based on a rise of the system clock at a timing t5 one clock earlier than the data output in the DLL-on mode. However, the internal clock has a phase delay with respect to the system clock supplied from an outside. Thus, in the actual DDR SDRAM, data output after receiving the read command is started at substantially the same time as in the DLL-on mode at the earliest or rather later than in the DLL-on mode. The period of time from the rise of the system clock at the timing T5, which is one clock earlier than the timing T6 determined by the CAS latency in the DDR-on mode, to start of the data output is indicated by tDQSCK (DLL off).

Now, read times of read data in the DLL-on mode and the DLL-off mode will be described. In the DDR3, a command and an address are given simultaneously. Thus, a time tAA (Address Access delay time) taken from determination of the address to start of output of the read data is given by Expression (1) or (2).

DLL-on tAAmin=$CL*tCK$min+
$tDQSCK$min(DLL on)             Expression (1)

DLL-off tAAmin=$(CL-1)*tCK$min+$tDQSCK$min
(DLL off)                       Expression (2)

Expression (1) gives the minimum value of the time tAA in the DLL-on mode. CL indicates the value of the CAS latency, tCKmin indicates the minimum value of one cycle of the system clock, tDQSKmin (DLL on) indicates the minimum value of the phase error of the DQS output signal with respect to the system clock input signal in the DLL-on mode. In the DLL-on mode, the DQS signal is synchronized with the system clock signal by the DLL circuit. Thus, even if the time tDQSCK (DLL on) is varied, the time tDQSCK assumes a small value on the order of at most −400 to 400 ps. Further, the time tDQSCK (DLL on) is varied in both positive and negative directions with respect to zero. Accordingly, the minimum value of the time tDQSCKmin (DLL on) assumes the value on the order of −400 to −200 ps.

Expression (2) gives the minimum value of the time tAA in the DLL-off mode. In Expression (2), tDQSCKmin (DLL off) indicates the minimum value of the delay time of the DQS output signal with respect to the system clock. In the DLL-off mode, the phase of the DQS output signal is not adjusted with respect to the system clock, and the DQS output signal is output with its phase kept delayed from the system clock. Accordingly, the time tDQSCK (DLL off) constantly assumes a positive value, and the minimum value of the time tDQSCKmin (DLL off) assumes a large value on the order of 2000 ps. Further, the time tDQSCK (DLL off) constantly assumes the positive value, and output of the DQS signal is delayed. Thus, the standard of the DDR3 defines that the edge of the clock that serves as a reference as in the DLL-off mode is based on CL−1, which is one cycle before the edge of the clock in the case of the DLL-on mode, as shown in Expression (2) described above.

FIG. 1 assumes the standard of the DDR3-800 using the system clock (bus clock) of MAX 400 MHz. Thus, when the minimum value tCKmin is set to 2500 ps, the minimum value tDQSCKmin (DLL on) is set to −400 ps, and the minimum value tDQSCKmin (DLL off) is set to 2000 ps, the minimum value DLL-on tAAmin assumes 14. 6 ns, and the minimum value DLL-off tAAmin assumes 14. 5 ns. Thus, it can be seen that the minimum value tAAmin does not greatly differ between the DLL-on mode and the DLL-off mode.

Patent Document 1

JP Patent Kokai Publication No. JP2005-332548A

Non-Patent Document 1

JEDEC STANDARD DDR3 SDRAM Specification, JESD79-3B, April, 2008, JEDEC Solid State Technology Association (JEDEC SOLID STATE TECHNOLOGY ASSOCIATION), page 37

SUMMARY

The entire disclosures in the above-mentioned Patent Document 1 and Non-Patent Document 1 are incorporated herein by reference thereto.

The following analysis is given by the present invention. Provision of the DLL-off mode in the DDR3 SDRAM is specified, as mentioned above. However, when the DLL-off mode is actually used, the problem that will be described below arises. Thus, the DLL-off mode is considered not to be used so much. As CPU performance becomes higher, an increasingly higher data transfer rate between a semiconductor memory device such as the DDR3 and a memory controller is demanded. In order to meet the demand, it is necessary to further increase the frequency of the system clock. However, the data read speed of the semiconductor memory device itself is not increased so much. Thus, it is necessary to increase the CAS latency corresponding to an increase in the frequency of the system clock.

FIG. 2 is a timing diagram of the DLL-on mode and the DLL-off mode when the frequency of the system clock (bus clock) is set to 933 MHZ and the CAS latency is set to 12 in the DDR3 SDRAM. FIG. 2 is the same as FIG. 1 except that the frequency of the system clock is increased from 400 MHz in FIGS. 1 to 933 MHZ in FIG. 2 and the CAS latency is set to be increased from six in FIG. 1 to 12 in FIG. 2. The standard of the DDR3 described in Non-patent Document 1 specifies that it is not necessary to support the DLL-off mode except when the CAS latency is set to six. Accordingly, the timing diagram of the DLL-off mode in FIG. 2 is virtual.

On contrast with FIG. 1, the CAS latency is increased in FIG. 2, corresponding to an increase in the frequency of the system clock. Thus, the delay time from reception of the read command to start of data output is not greatly changed in the DLL-on mode. However, with respect to a data transfer time after the start of data output, a data transfer speed is increased, corresponding to the increase in the frequency of the system clock.

On the other hand, a data output operation is started, based on a timing T11, which is one cycle earlier than a timing T12 of a 12th clock after receiving the read command. In the DLL-off mode, a read data output operation is started based on a timing one cycle earlier than in the DLL-on mode, which is the same as in the case shown in FIG. 1 where the CAS latency is six. However, in the DLL-off mode, the phase of the internal clock is delayed with respect to the system clock supplied from the outside. The delay time inside the semiconductor memory device is substantially the same, without depending on the frequency of the system clock. Accordingly, the more the frequency of the system clock is increased, the more the phase delay of the internal clock with respect to the system clock increases.

Referring to FIG. 2, when the minimum value tCKmin is set to 1072 ps, the minimum value tDQSCKmin (DLL on) is set to −195 ps, and the minimum value tDQSCKmin (DLL off) is set to 2000 ps, the minimum value DLL-on tAAmin assumes 12.65 ns, and the minimum value DLL-off tAAmin assumes 13.77 ns. Even if the DDR3 is operated at a highest speed in the DLL-off mode with respect to the DLL-on mode, the performance of the read access time tAA is degraded. In other words, even if the performance of a read data read time of the semiconductor memory device guarantees the read access time tAAmin of 12.65 ns, the DDR3 in the DLL-off mode can be used at most in the state where the read access time is 13.77 ns at the highest.

A controller according to a first aspect of the invention includes a set of first terminals to be coupled to a device that is under control of the controller; and a control circuit configured to generate and output onto the set of first terminals edge specifying information that takes a selected one of first and second states, the edge specifying information being supplied to the device to cause the device to activate a data strobe signal at a first timing when the selected one of the edge specifying information is the first state and at a second timing, that is different from the first timing, when the edge specifying information is the second state, the control circuit being further configured to generate and output onto the set of first terminals a read command, the read command being supplied to the device to cause the device to return to the controller a data signal while activating the data strobe signal at one of the first and second timings that is designated by the selected one of the states of the edge specifying information.

A controller according to a second aspect of the present invention includes a set of first terminals to be coupled to a device that is under control of the controller, and a control circuit configured: to communicate the device through the set of first terminals to carry out a read test on the device, to generate and output, in response to a result of the read test, onto the first set of terminals edge specifying information that takes a selected one of a plurality of states, the edge specifying information causing the device to activate a data strobe signal at a first timing when the selected one of the edge specifying information is a first state and at a second timing, that is different from the first timing, when the selected one of the edge specifying information is a second state; and to generate and output onto the first set of terminals a read command that causes the device to return to the controller a data signal while activating the data strobe signal at one of the first and second timings that is designated by the selected one of the states of the edge specifying information.

A method according to a third aspect of the present invention includes carrying out a read test on a semiconductor memory device to be controlled, and producing, in response to a result of the read test, edge specifying information that takes a selected one of a plurality of states, a first one of the states of the information instructing the semiconductor memory device to commence activation of a strobe signal at a first timing, and a second one of the states of the information instructing the semiconductor memory device to commence activation of the strobe signal at a second timing that is different from the first timing, and issuing a data read command that instructs the semiconductor memory device to return a data signal while commencing activation of the data strobe signal at one of the first and second timings that is designated by the selected one of the states of the edge specifying information.

A memory system according to a fourth aspect of the present invention includes:

semiconductor memory devices each including:

a synchronous circuit for generating output signals phase aligned with a system clock supplied from an outside;

a synchronous circuit selection register that performs switching between a synchronous circuit selection mode and a synchronous circuit non-selection mode, wherein read data is output by adjusting a phase of the read data with respect to the system clock using the synchronous circuit in the synchronous circuit selection mode, and wherein the read data is output using an internal clock generated from the system clock as a reference, without using the synchronous circuit in the synchronous circuit non-selection mode; and a reference edge specifying register that specifies an edge of the system clock which serves as the reference in the synchronous circuit non-selection mode; and a memory controller that sets the synchronous circuit selection register and the reference edge specifying register, and controls an operation of the semiconductor memory device, the memory controller setting the reference edge specifying register according to a frequency of the system clock when the synchronous circuit selection register is set to the synchronous circuit non-selection mode.

A semiconductor device according to a fifth aspect of the present invention includes:

a source synchronous data transfer circuit that outputs a transfer clock and data in synchronization with the transfer clock, in response to a command supplied from an outside in synchronization with the system clock;

a synchronous circuit for generating output signals phase aligned with the system clock;

a synchronous circuit selection circuit that performs switching between a synchronous circuit selection mode and a synchronous circuit non-selection mode, wherein a phase of the data with respect to the system clock is adjusted by the synchronous circuit to operate the source synchronous data transfer circuit in the synchronous circuit selection mode, and wherein the source synchronous data transfer circuit is operated using an internal clock as a reference without using the synchronous circuit in the synchronous circuit non-selection mode; and a reference edge specifying register that specifies an edge of the internal clock which serves as the reference;

the source synchronous data transfer circuit being operated using the edge of the internal clock specified by the reference edge specifying register as the reference in the synchronous circuit non-selection mode.

The meritorious effects of the present invention are summarized as follows.

In the semiconductor memory device according to the present invention, which operates in synchronization with the system clock supplied from the outside and outputs read data, and in the memory system according to the present invention that uses the semiconductor memory devices, even if the synchronous circuit such as a DLL or a PLL is not used, an access time substantially equal to that achieved through the use of the synchronous circuit can be ensured.

Further, in the semiconductor device according to the present invention, which operates in synchronization with the system clock supplied from the outside and outputs data, even if the synchronous circuit such as the DLL or PLL is not used, an access time comparable to that achieved through the use of the synchronous circuit can be ensured.

PREFERRED MODES

Figure 1:
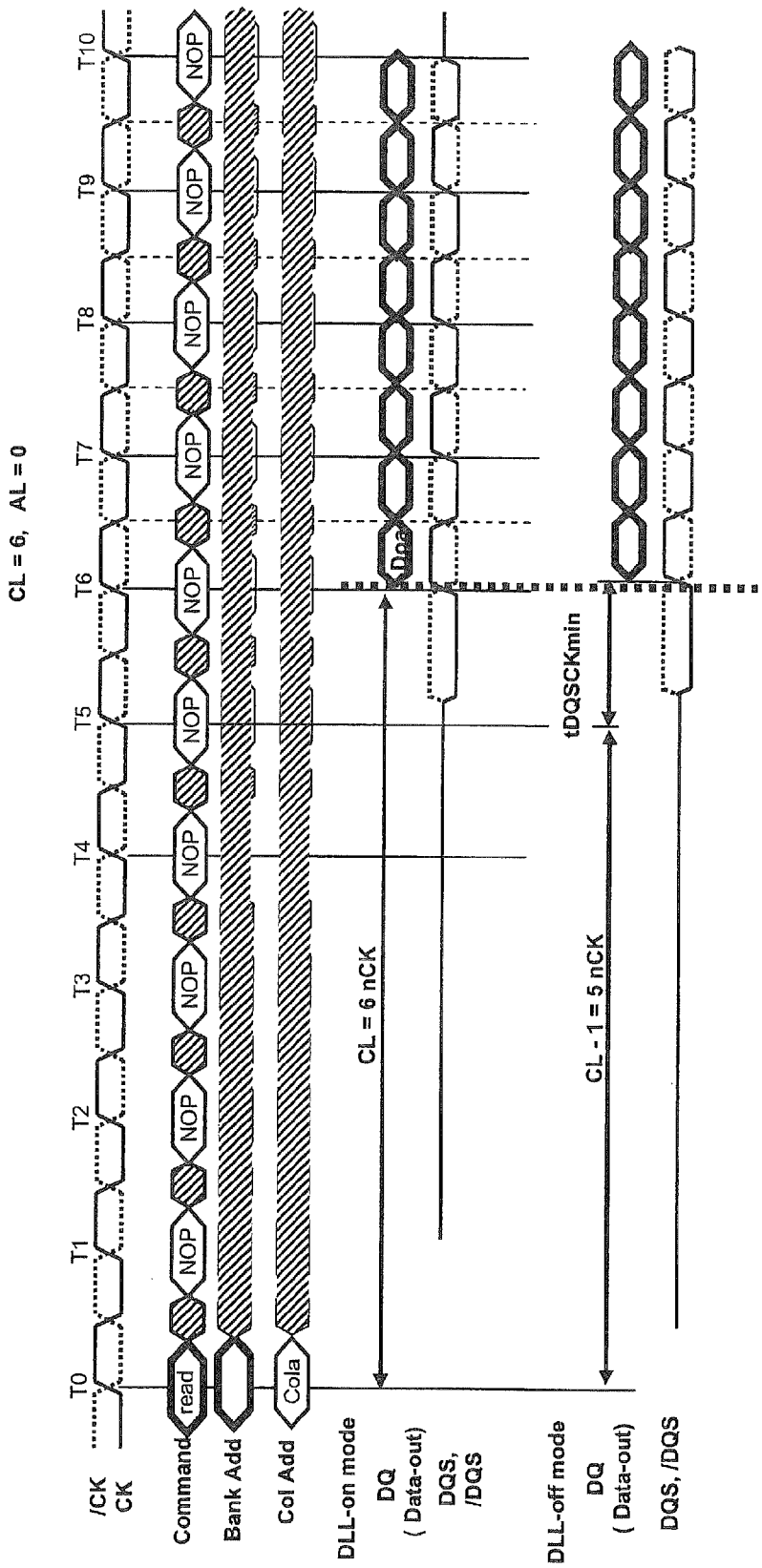
FIG. 1 is a timing diagram when a read command is executed in a semiconductor memory device of a related art.

Exemplary embodiments of the present invention will be described with reference to drawings as necessary. The drawings and reference symbols in the drawings that are cited in the description of the exemplary embodiments are shown as an example of the exemplary embodiments, and do not thereby limit variations of the exemplary embodiments of the present invention.

Figure 4:
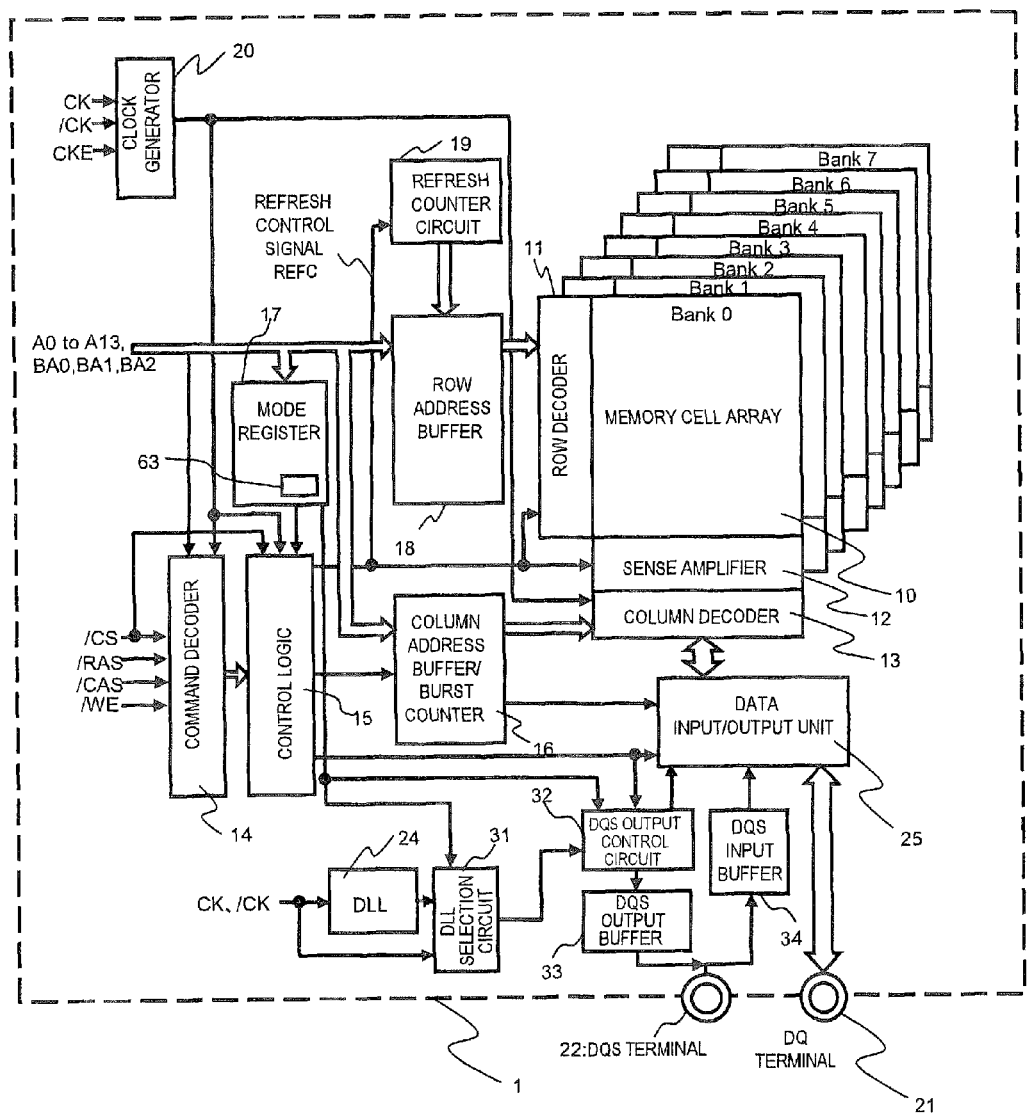
FIG. 4 is a configuration diagram of an overall semiconductor memory device in the example of the present invention.

A semiconductor memory device 1 in the exemplary embodiment of the present invention is the semiconductor memory device 1 that operates in synchronization with a system clock CK supplied from an outside, as shown in FIG. 4, for example. The semiconductor memory device 1 includes a synchronous circuit 24 for generating output signals DQS and DQ that are phase aligned with the system clock CK, a synchronous circuit selection circuit 31 that performs switching between a synchronous circuit selection mode and a synchronous circuit non-selection mode, and a reference edge specifying register 63 that specifies the edge of an internal clock which serves as a reference for outputting read data in the synchronous circuit non-selection mode. In the synchronous circuit selection mode, read data is output by adjusting a phase deviation of the internal clock with respect to the system clock supplied from the outside, using the synchronous circuit 24. In the synchronous circuit non-selection mode, the read data is output in synchronization with the internal clock without using the synchronous circuit. Assume that the phase of the internal clock is delayed from the system clock by one cycle or more when the CAS latency has been set to a large value and the frequency of the system clock has been increased in the synchronous circuit non-selection mode, for example. In the above-mentioned configuration, the reference edge specifying register that specifies the edge of the internal clock which serves as the reference for outputting read data in the synchronous circuit non-selection mode is provided. Thus, by specifying the edge that occurs earlier than an edge used for starting output of the read data in the synchronous circuit selection mode by the reference edge specifying resister even in this case, an output timing of the read data is not so greatly delayed as in the synchronous circuit selection mode. On the other hand, when the CAS latency is set to a small value and the system clock with a low frequency is used, the edge that occurs later than the delayed phase of the internal clock is specified by the reference edge specifying register. An error at a read access time does not thereby occur.

The synchronous circuit of the semiconductor memory device 1 in the exemplary embodiment of the present invention is a DLL circuit or a PLL circuit, as shown in FIG. 4, for example. The synchronous circuit of the present invention is provided to generate the output signals phase aligned with the system clock. The DLL circuit is most often used as the synchronous circuit for this purpose. In addition to the DLL circuit, the PLL (Phase Locked Loop) circuit, for example, may be used to generate the output signals phase aligned with the system clock.

As shown in FIG. 4, for example, in the semiconductor memory device 1 in the exemplary embodiment of the present invention, the read data is output in synchronization with the read data strobe signal DQS. The read strobe signal DQS is output in synchronization with the system clock CK in the synchronous circuit selection mode and is output in synchronization with the internal clock in the synchronous circuit non-selection mode. By using a source synchronous circuit that outputs the data in synchronization with the data strobe signal, a high-speed data transfer is implemented. In the synchronous circuit selection mode, the data strobe signal is output in synchronization with the system clock supplied from the outside.

In the semiconductor memory device 1 of the present invention, the synchronous circuit is stopped in the synchronous circuit non-selection mode. The synchronous circuit such as the DLL circuit or the PLL circuit is normally operated at a high speed. Thus, the synchronous circuit uses large power. In the synchronous circuit non-selection mode, however, the synchronous circuit can be stopped to reduce power consumption of the synchronous circuit.

Figure 5:
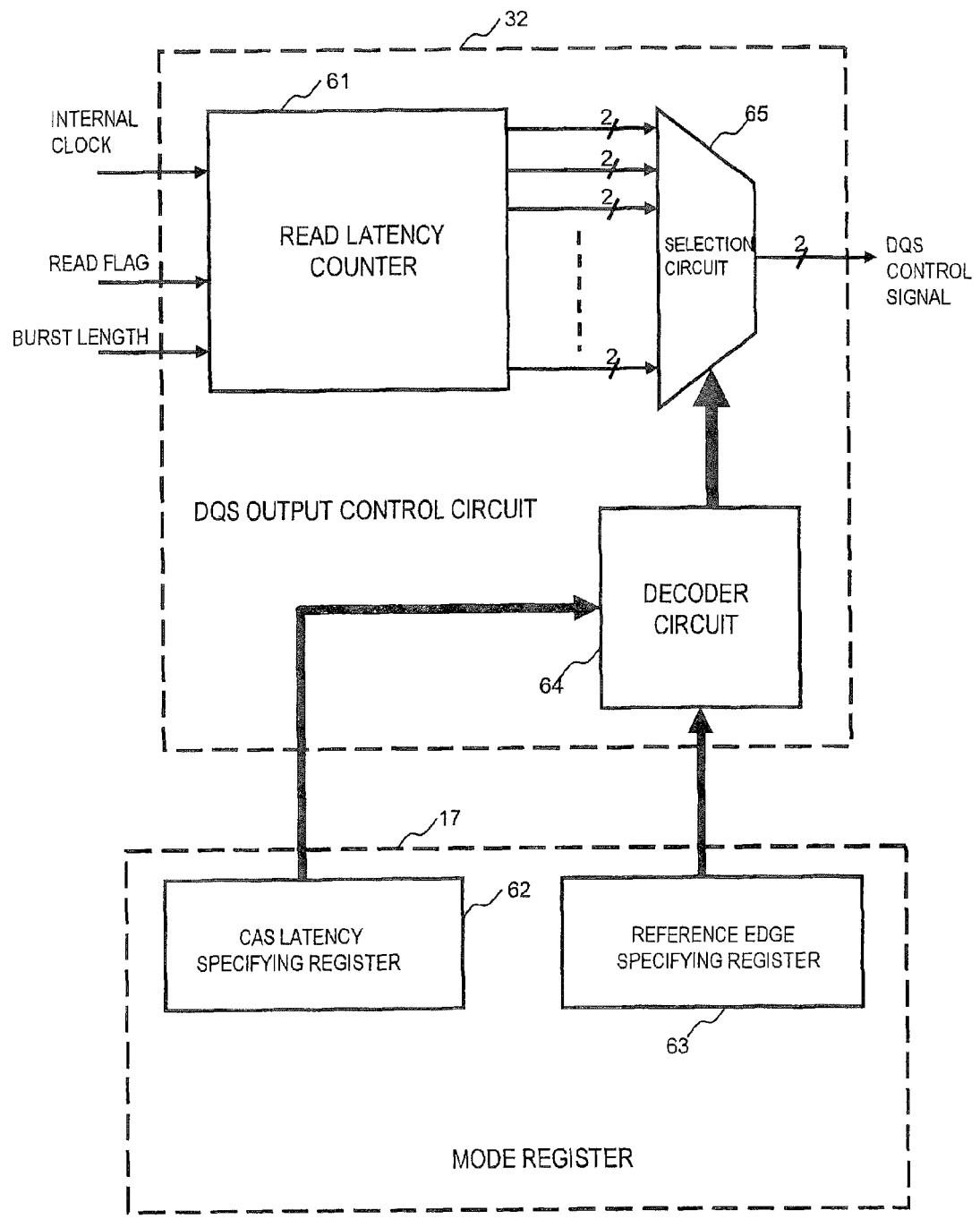
FIG. 5 is a circuit diagram of a portion related to a DQS output control circuit in the semiconductor memory device in the example of the present invention.

As shown in FIG. 5, for example, the semiconductor memory device 1 in the exemplary embodiment of the present invention further includes a CAS latency specifying register 62 that specifies the number of clocks of the system clock from reception of a read command to start of output of the read data in the synchronous circuit selection mode. Then, in the synchronous circuit non-selection mode, by a combination of the number of clocks specified by the CAS latency specifying register 62 and the edge of the internal clock which serves as the reference, specified by the reference edge specifying register 63, a timing of starting output of the read data after reception of the read command is specified. By determining the timing of outputting the read data by the combination of the number of clocks specified by the CAS latency specifying register and the edge specified by the reference edge specifying register, an operation in the synchronous circuit non-selection mode, which is closest as possible as in the synchronous circuit selection mode, can be performed.

As shown in FIG. 5, for example, the semiconductor memory device 1 in the exemplary embodiment of the present invention includes a read latency counter 61 that counts the number of clocks after the read command has been received, a decoder circuit 64 that decodes an output signal of the CAS latency specifying register 62 and an output signal of the reference edge specifying register 63, and specifies the number of clocks of the internal clock until output of the read data is started, and a selection circuit 65 that selects and outputs, from among timing signals output by the read latency counter 61, a timing signal indicating the number of clocks specified by the decoder circuit 64, as a read data output starting signal (DQS control signal).

A read wait time adjustment method of a semiconductor memory device 1 in an exemplary embodiment of the present invention is the read wait time adjustment method of the semiconductor memory device 1 including a synchronous circuit selection register (which is one of registers in a mode register 17), a CAS latency specifying register 62, and a reference edge specifying register 63. The synchronous circuit selection register performs selection between a synchronous circuit selection mode and a synchronous circuit non-selection mode. In the synchronous circuit selection mode, read data DQ is output by adjusting the phase of the read data DQ with respect to a system clock CK by a synchronous circuit 24. In the synchronous circuit non-selection mode, an operation of the synchronous circuit 24 is stopped and the read data is output without using the synchronous circuit 24. The CAS latency specifying register 62 specifies the number of clocks of the system clock from reception of a read command to start of output of the read data in the synchronous circuit selection mode. The reference edge specifying register 63 specifies the edge of an internal clock in the synchronous circuit non-selection mode. The edge of the internal clock serves as a reference for starting output of the read data. In this method, the edge is specified by the reference edge specifying register 63 so that a phase delay of the read data DQ with respect to the system clock CK is cancelled, in view of the frequency of the system clock CK and the phase delay, in the synchronous circuit non-selection mode. When the edge that occurs earlier than an edge used for starting output of the read data in the synchronous circuit selection mode is selected by the reference edge specifying register, the phase delay of the internal clock with respect to the system clock can be compensated for. This method is effective especially when there is the phase delay of one cycle or more.

In the read wait time adjustment method of the semiconductor memory device 1 in the exemplary embodiment of the present invention, the read data is output in synchronization with a read data strobe signal DQS. The read data is output by adjusting the timing of the read data strobe signal DQS so that the phase delay is canceled. The read data is output in synchronization with the read strobe signal. Thus, a data output timing can also be adjusted to an appropriate timing when the output timing of the read data strobe signal can be adjusted to an appropriate timing.

A read wait time adjustment method of a synchronous-type semiconductor memory device 1 in an exemplary of the present invention is the read wait time adjustment method of the synchronous-type semiconductor memory device 1 in which output of read data is started after a predetermined CAS latency in response to a read command supplied from an outside in synchronization with a system clock CK. In this method, without using a synchronous circuit 24 for generating output signals phase aligned with the system clock CK, the synchronous-type semiconductor memory device 1 is made compatible with a semiconductor memory device 1 in which the read data is output with an output timing of the read data synchronized with the system clock by the synchronous circuit 24. A reference edge specifying register 63 that specifies the edge of an internal clock which serves as a reference for outputting the read data is provided. Then, by specifying the edge that is arbitrary and precedes an edge determined by the CAS latency by the reference edge specifying register 63, the delay of the internal clock with respect to the system clock CK is compensated for. That is, the semiconductor memory device in the above exemplary embodiment may be a semiconductor memory device without including the synchronous circuit. The semiconductor memory device with the synchronous circuit may be replaced by even such a semiconductor memory device. That is, a large phase delay of the internal clock with respect to the system clock can be compensated for by specifying the edge that precedes the edge determined by the CAS latency by the reference edge specifying register. Accordingly, the semiconductor memory device of a related art including the synchronous circuit such as a DLL can be replaced by the semiconductor memory device without including the synchronous circuit in the above exemplary embodiment.

In the read wait time adjustment method of the semiconductor memory device 1 in the exemplary embodiment of the present invention, the synchronous circuit 24 can be set to a DLL circuit 24 or a PLL circuit.

Figure 3:
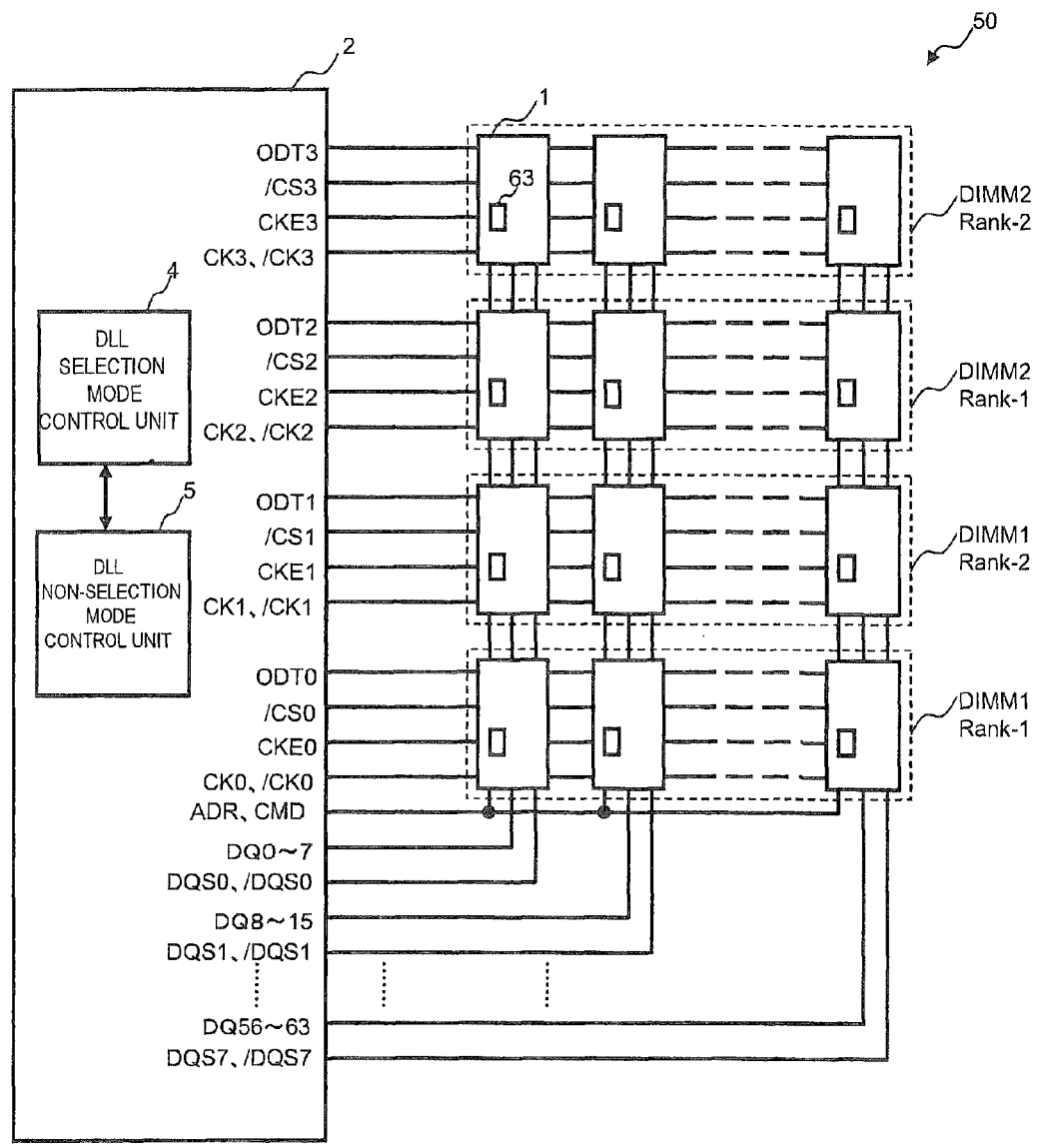
FIG. 3 is a configuration diagram of an overall memory system in an example of the present invention.

As shown in FIG. 3, for example, a memory system 50 in an exemplary embodiment of the present invention includes a memory controller 2 and semiconductor memory devices 1 each including a synchronous circuit 24 for generating output signals phase aligned with a system clock supplied from an outside, a synchronous circuit selection register (which is one of registers in a mode register 17), and a reference edge specifying register 63. The synchronous circuit selection register performs switching between a synchronous circuit selection mode and a synchronous circuit non-selection mode. In the synchronous circuit selection mode, read data is output by adjusting the phase of the read data with respect to the supplied system clock using the synchronous circuit. In the synchronous circuit non-selection mode, the read data is output using an internal clock generated from the system clock as a reference, without using the synchronous circuit. The reference edge specifying register 63 specifies the edge of the system clock CK that serves as the reference in the synchronous circuit non-selection mode. The memory controller 2 sets the synchronous circuit selection register and the reference edge specifying register, and controls an operation of the semiconductor memory device. When the synchronous circuit selection register is set to the synchronous circuit non-selection mode, the memory controller 2 sets the reference edge specifying register according to the frequency of the system clock. The memory controller 2 in the exemplary embodiment includes a DLL non-selection mode control unit 5, in addition to a DLL selection mode control unit 4 that controls the semiconductor memory devices each of which uses a common DLL. In the DLL non-selection mode, the reference edge specifying register of the semiconductor memory device 1 is set to compensate for a phase delay of the internal clock according to the frequency of the system clock in the semiconductor memory device 1 in the synchronous circuit non-selection mode, thereby allowing a high-speed access even if the semiconductor memory device 1 does not select the DLL.

In the memory system 50 in the exemplary embodiment of the present invention, the synchronous circuit 24 of the semiconductor memory device 1 is a DLL 24 or a PLL circuit. The output signals phase aligned with the system clock supplied from the outside can be generated by the DLL circuit or the PLL circuit.

As shown in FIG. 5, for example, the memory system 50 in the exemplary embodiment of the present invention further includes a CAS latency specifying register 62 that specifies the number of clocks of the system clock from reception of a read command to start of output of the read data in the synchronous circuit selection mode. The larger the number of clocks set in the CAS latency specifying register 62 is, the edge that occurs much earlier than an edge used for starting output of read data in the synchronous circuit selection mode is specified by the reference edge specifying register.

As shown in FIG. 4, for example, a semiconductor device 1 in an exemplary embodiment of the present invention includes a source synchronous data transfer circuit (25 and 32 to 34), a synchronous circuit 24 for generating output signals phase aligned with a system clock CK, a synchronous circuit selection circuit 31, and a reference edge specifying register 63. The source synchronous data transfer circuit outputs a transfer clock DQS and data in synchronization with the transfer clock DQS, in response to a command supplied from an outside in synchronization with the system clock CK. The synchronous circuit selection circuit 31 performs switching between a synchronous circuit selection mode and a synchronous circuit non-selection mode. In the synchronous circuit selection mode, the source synchronous data transfer circuit (25 and 32 to 34) is operated by adjusting the phase of the data with respect to the system clock CK, using the synchronous circuit 24. In the synchronous circuit non-selection mode, the source synchronous data transfer circuit (25 and 32 to 34) is operated using an internal clock as a reference, without using the synchronous circuit. The reference edge specifying register 63 specifies the edge of the internal clock that serves as the reference. In the synchronous circuit non-selection mode, the source synchronous data transfer circuit (25 and 32 to 34) is operated, using the edge of the internal clock specified by the reference edge specifying register 63 as the reference. The semiconductor device 1 of the present invention is not limited to a memory. The semiconductor device 1 can be applied to a semiconductor device which includes a source synchronous transfer circuit that outputs a transfer clock and data in response to a command supplied from an outside in synchronization with a system clock and can select whether to use a synchronous circuit or not. In a source synchronous transfer method, a transmission side outputs a transfer clock together with data. Thus, there is no phase deviation between the clock and the data. Accordingly, the source synchronous transfer method is used in other system as well as in a memory system, as a method capable of transferring high-speed data. The exemplary embodiment mentioned above is effective in a case where a system clock is supplied from an outside and a transfer clock and data are transferred in synchronization with the system clock.

As shown in FIG. 4, for example, the synchronous circuit 24 in the semiconductor device 1 in the exemplary embodiment of the present invention is a DLL circuit 24 or a PLL circuit. When the DLL circuit 24 or the PLL circuit is used, output signals DQS and DQ that are phase aligned with the system clock CK can be generated.

As shown in FIG. 4, for example, in the semiconductor device 1 in the exemplary embodiment of the present invention, the number of clocks of the system clock CK from reception of the command to output of the data by the source synchronous data transfer circuit is determined in advance, in the synchronous circuit selection mode. In the synchronous circuit non-selection mode, the edge of the internal clock may be specified by the reference edge specifying register 63 so that a phase delay of the internal clock with respect to the system clock CK is compensated for. That is, the time from reception of the command to start of output of the data can be ensured with a certain precision, even if the synchronous circuit is not used.

As shown in FIG. 5, for example, the semiconductor device 1 in the exemplary embodiment of the present invention further includes a latency specifying register 62 that specifies the number of clocks of the system clock from reception of the command to output of the data by the source synchronous data transfer circuit. In the synchronous circuit non-selection mode, the source synchronous data transfer circuit (25 and 32 to 34) starts data transfer based on a combination of the number of clocks specified by the latency specifying register 62 and the edge specified by the reference edge specifying register 63.

As shown in FIG. 5, for example, the semiconductor device 1 in the exemplary embodiment of the present invention includes a latency counter 61 that counts the number of clocks after reception of the command, a decoder circuit 64 that decodes an output signal of the latency specifying register 62 and an output signal of the reference edge specifying register 63 and specifies the number of clocks of the internal clock until the source synchronous transfer circuit (25 and 32 to 34) starts the data transfer, and a selection circuit 65 that selects and outputs, from among timing signals output by the latency counter 61, a timing signal indicating the number of clocks specified by the decoder circuit 64, as a data transfer starting signal.

In the semiconductor device 1 in the exemplary embodiment of the present invention, the synchronous circuit is stopped in the synchronous circuit non-selection mode. Unless the synchronous circuit is used for other purpose in the synchronous circuit non-selection mode, the DLL circuit can be stopped and power consumption can be reduced. A description will be given below in connection with an example in detail with reference to drawings.

First Example

FIG. 3 is a configuration diagram of an overall memory system in an example of the present invention. FIG. 3 is the memory system for reading and writing of 64 bits in parallel. A semiconductor memory device 1 is used for reading and writing of eight bits in parallel. Eight semiconductor memory devices 1 are connected in parallel to perform reading and writing of 64 bits in parallel. In the memory system in FIG. 3, a configuration is assumed in which two ranks of the semiconductor memory devices 1 of are respectively mounted on two DIMMs (Dual Inline Memory Modules). That is, the memory system is formed of the semiconductor memory devices of a total of four ranks which are indicated by DIMM1 Rank-1, DIMM1 Rank-2, DIMM2 Rank-1, and DIMM2 Rank-2. Each rank is further formed of the eight semiconductor memory devices 1. A total of 4 ranks*8=32 semiconductor memory devices 1 are mounted. FIG. 3 illustrates only three of the eight semiconductor memory devices 1 connected in parallel. Signals that control these 32 semiconductor memory devices 1 are supplied from the memory controller 2, and data input/output is performed between the memory controller and each of the semiconductor memory devices.

Referring to FIG. 3, the memory controller 2 is directly connected to each semiconductor memory device 1. The memory system may include a so-called Registered DIMM or a Fully Buffered DIM (FBD1MM) in which a PLL or a buffer register is arranged between the memory controller 2 and the semiconductor memory device 1 for each DIMM, and timing synchronization with the memory controller is sought for each DIMM. The memory controller 2 may be an LSI having a function dedicated for memory control. Alternatively, a CPU may directly control the memory. Alternatively, the memory controller 2 may be formed of a plurality of LSIs.

Referring to FIG. 3, reference characters ADR and CMD respectively indicate an address signal and a command signal, which are connected in common to the semiconductor memory devices 1 of each rank. The command signal CMD includes a row address strobe signal/RAS, a column address strobe signal/CAS, and a write enable signal/WE. Signals DQ0 to DQ63 are bidirectional data input/output signals used for transfer of read/write data or the like between the memory controller 2 and the semiconductor memory devices 1. It is assumed that each semiconductor memory device 1 is used for input/output of eight bits in parallel. Thus, the eight semiconductor memory devices 1 are connected in parallel in order to accommodate 64 bits of the signals DQ0 to DQ63. These data input/output signals DQ0 to DQ63 are also connected in common to each rank. DQS0 and /DQS0 signals, DQS1 and /DQS1 signals, DQS2 and /DQS2 signals, DQS3 and /DQS3 signals, DQS4 and /DQS4 signals, DQS5 and /DQS5 signals, DQS6 and /DQS6 signals, and DQS7 and /DQS7 signals are respectively differential data strobe signals. Each pair of the differential data strobe signals is transferred to a corresponding one of the semiconductor memory devices 1 from the memory controller 2 at a time of a write operation, and is transferred to the memory controller 2 from the corresponding one of the semiconductor memory devices 1 at a time of a read operation. These DQS and /DQS signals are bidirectional input/output signals. The data strobe DQS and /DQS signals output by the semiconductor memory device 1 at the time of the read operation are synchronized with a change point of read data. Thus, when the DQS and /DQS signals are used as the strobe signals on the side of the memory controller 2, the phases of the DQS and /DQS signals are shifted at a timing in which a data signal can be latched. These data strobe signals DQS0 to DQS7 and /DQS0 to /DQS7 are also connected in common to each rank of the semiconductor memory devices. However, an independent pair of the DQS and /DQS signals is connected to each of the eight semiconductor memory devices 1 of each rank connected in parallel.

Clock signals CK0 to CK3 and /CK0 to /CK3, clock enable signals CKE0 to CKE3, chip select signals /CS0 to /CS3, and embedded termination resistor control signals ODT0 to ODT3 are signals that are output from the memory controller 2 to the semiconductor memory devices 1. Different ones of these signals that are independent are output for each rank. The clock signals CK0 to CK3 and /CK0 to /CK3 are signals that are supplied to the semiconductor memory devices 1 as system clocks. A command for a read, a write, or the like supplied from the memory controller 2 to the semiconductor memory device 1 is supplied in synchronization with each of the system clocks. The clock enable signals CKE0 to CKE3 are signals each of which determines whether the corresponding clock CK is valid or invalid. When the clock enable signal CKE is high at a rising edge of the corresponding clock CK, the subsequent rising edge of the corresponding clock CK is valid. Edges of the corresponding clock CK other than the subsequent rising edge are invalid. When each of the chip select signals /CS0 to /CS3 is low, input of a command is valid. When each of the chip select signals /CS0 to /CS3 is high, the command is ignored. Operation, however, is continued. By supplying the command to the semiconductor memory device of an arbitrary one of the ranks using this chip select signal, a selective access can be made. When values of termination resistances inside the respective memory devices 1 are not infinite, the embedded termination resistance control signals ODT0 to ODT3 can control turning on or off of the termination resistances.

Referring to FIG. 3, each semiconductor memory device 1 includes a reference edge specifying register 63. Since each semiconductor memory device 1 includes the reference edge specifying register 63, a read access time tAA can be set to an appropriate value even in a DLL non-selection mode in which a DLL circuit is not used, as will be described later in detail.

The memory controller 2 includes a DLL selection mode control unit 4 and a DLL non-selection mode control unit 5. The DLL selection mode control unit 4 herein performs control when each semiconductor memory device 1 can internally and automatically phase align the DQS and DQ signals with the system clock and output the DQS and DQ signals using the DLL circuit. When the semiconductor memory device 1 is in a DLL selection mode, the semiconductor memory device 1 can independently phase align the DQS and DQ signals. Thus, the memory controller 2 does not need to perform control over a phase delay of the semiconductor memory device, in particular. The control by this DLL selection mode control unit 4 is the same as control by a related art memory controller.

On the other hand, when the semiconductor memory device 1 is set to a DLL non-selection mode, the semiconductor memory device 1 cannot independently compensate for a delay of an internal clock with respect to the system clock CK. When no control is performed, the phase delay of the internal clock of the semiconductor memory device 1 with respect to the system clock CK becomes the phase delay of the DQS output signal or the DQ signal, thereby deteriorating a characteristic of the read access time tAA. Accordingly, when the semiconductor memory device 1 is set to the DLL non-selection mode, the DLL non-selection mode control unit 5 sets the reference edge specifying register so that an edge of the clock that serves as a reference for outputting read data is a more preceding edge to compensate for the phase delay of the internal clock. This operation is performed to prevent the phase delay of the internal clock of the semiconductor memory device 1 from becoming the phase delay of the DQS output signal or the DQ signal to deteriorate the read access time tAA.

When the semiconductor memory device 1 is used in the DLL non-selection mode alone in FIG. 3, the DLL selection mode control unit 4 does not need to be provided at the memory controller 2. In this case, the DLL non-selection mode control unit 5 can control the semiconductor memory device 1 even if the DLL selection mode control unit 4 is not provided.

Next, FIG. 4 is a configuration diagram of the entirety of the semiconductor memory device 1. Referring to FIG. 4, reference numeral 10 denotes memory cell arrays, reference numeral 11 denotes row decoders each of which decodes a row address and drives a selected word line, reference numeral 12 denotes sense amplifiers, reference numeral 13 denotes column decoders each of which decodes a column address and selects a selected bit line, reference numeral 14 denotes a command decoder that receives a predetermined address signal and command signals (chip select /CS, row address strobe /RAS, column address strobe /CAS, and write enable /WE signals) and decodes a command, reference numeral 15 denotes a control logic, reference numeral 16 denotes a column address buffer/burst counter, reference numeral 17 denotes a mode register that receives addresses A0 to A13 and signals BA0, BA1 and BA2 for bank selection (selection of one of eight banks), reference numeral 18 denotes a row address buffer, reference numeral 19 denotes a refresh counter circuit that receives a refresh control signal REFC, counts up, and outputs a count output as a refresh address, reference numeral 20 denotes a clock generator, reference numeral 21 denotes a data input/output terminal (DQ terminal) for receiving/outputting write/read data from/to an outside, and reference numeral 24 denotes a DLL, and reference numeral 25 denotes a data input/output unit that performs data input/output between the DQ terminal and one of the memory cell arrays 10, in synchronization with a clock supplied from the DLL.

Further, a DQS output control circuit 32 and a DQS output buffer 33 that control output of the strobe signal DQS to be output at a time of a data read and are provided. When a read command is executed, the DQS signal for which the timing has been adjusted by the DQS output control circuit 32 and which has been amplified by the DQS output buffer 33 is output from a DQS terminal 22. Further, data is output from the DQ terminal 21, in synchronization with output of the DQS signal. When a write command is executed, the data strobe signal is received through the DQS terminal 22, and data is captured into the data input/output unit 25 through the DQ terminal, in synchronization with the DQS signal shaped by the DQS input buffer 34.

At the mode register 17, a CAS latency specifying register, illustration of which is omitted in FIG. 4 and which specifies a CAS latency and a DLL selection register that performs switching between the DLL selection mode and the DLL non-selection mode are provided, in addition to the reference edge specifying register 63. An output of the DLL selection register is supplied to a DLL selection circuit 31. Then, it can be selected whether to use the clock that has been phase adjusted by the DLL 24 or whether to use the internal clock that is phase delayed and is not phase adjusted by the DLL 24, as a clock for the DQS output control circuit 32 without alteration, as the internal clock to be supplied to the DQS output control circuit. When the DLL non-selection mode has been set, the DLL 24 can be turned off, and consumption of power by the DLL 24 can be thereby reduced. Alternatively, when the DLL non-selection mode has been set, power of the DLL may be automatically turned off. When dynamic switching is made between the DLL section mode and the DLL non-selection mode, it takes time for the DLL to become a stable locked state after the DLL has been turned on. Thus, when switching is made from the DLL non-selection mode to the DLL selection mode, the DLL may be first turned on from off, and locking of the DLL may be waited for (for 512 clocks of the CK signal, for example), thereby automatically making switching from the DLL non-selection mode to the DLL selection mode.

FIG. 5 is a circuit diagram in the vicinity of the DQS output control circuit 32. The DQS output control circuit 32 includes a read latency counter 61, a decoder circuit 64, and a selection circuit 65. The read latency counter 61 operates, upon receipt of the internal clock selected by the DLL selection circuit 31. An output signal indicating a read flag and an output signal of a burst length register included in the mode register 17 are supplied to the read latency counter 61 as control signals. The read flag is a flag that is set when the read command is received and is reset when output of data of a predetermined burst length is completed. As a basic operation of the read latency counter 61, counting of the internal clock is started when the read command is received and the read flag is set. In order to generate the signal that controls the DQS terminal, the read latency counter 61 generates a signal which provides basis for a read preamble after a predetermined number of clocks have been counted. Then, the read latency counter 61 generates a signal that provides basis for a toggle output of the DQS terminal according to the length of the burst length, and finally generates a signal that provides basis for a post preamble. Since the DQS buffers are the input and output buffers, control to set the buffers to an input mode or an output mode and control to output a high level or a low level when the output mode has been set are performed using a two-bit signal. Accordingly, the read latency counter 61 also basically outputs two-bit control signals.

The read latency counter 61 outputs a plurality of types of control signals according to selection of the CAS latency. Each of the control signals is the control signal of two bits constituted from a bit that controls the DQS buffer input/output mode and a bit that controls whether to output the high level or the low level in the output mode. In other words, the plurality of types of DQS control signals having different timings are output from the read latency counter 61, in preparation for selection of a read latency.

The decoder circuit 64 decodes output signals of a CAS latency specifying register 62 and the reference edge specifying register 63 included in the mode register 17, and determines an output timing of the DQS signal. In the DLL selection mode, it is not necessary to use the reference edge specifying register 63. Thus, an output value of the reference edge specifying register 63 may be masked to be supplied to the decoder circuit. Alternatively, the output signal of the CAS latency specifying register may be supplied to the selection circuit 65 through the decoder circuit, without alteration. The decoder circuit 64 may determine the output timing of the DQS output signal, based on a combination of the output signals of the CAS latency specifying register 62 and the reference edge specifying register 63. Thus, the decoder circuit may be formed of an adding and subtracting circuit or the like which modifies the specified value of the CAS latency specifying register by the specified value of the reference edge specifying register.

The selection circuit 65 selects a set of the control signals from a plurality of sets of the DQS control signal candidates (each formed of two bits) having the different output timings, output by the read latency counter, based on a signal output by the decoder circuit 64 and outputs the selected set of the control signals as the DQS control signal (of two bits). The DQS output signal is output to the data input/output unit 25 as well as the DQS output buffer, and is used for controlling the output timing of the data signal output from the DQ terminal.

Figure 2:
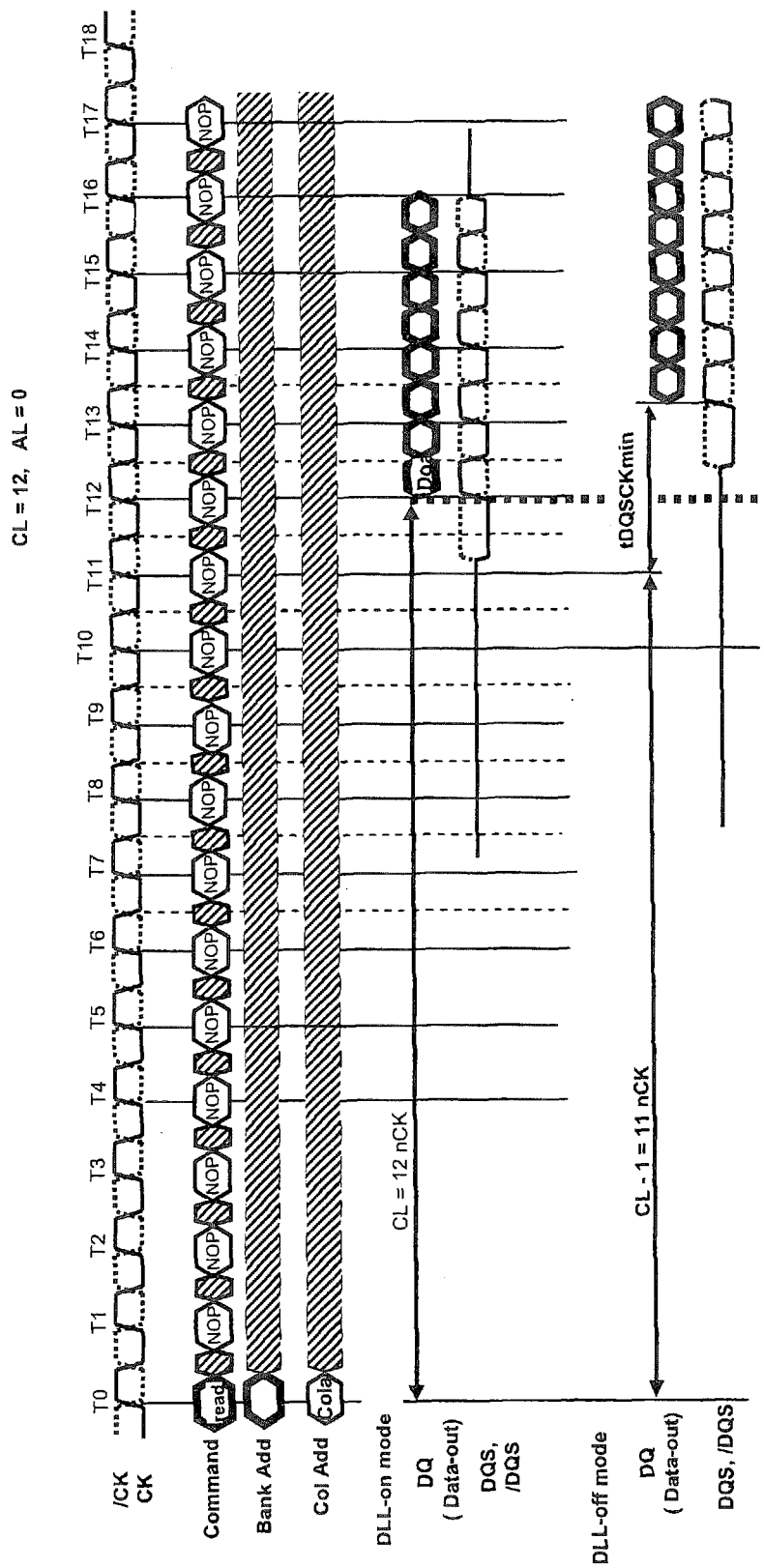
FIG. 2 is a timing diagram when a clock frequency has been increased and a CAS latency has been increased in the semiconductor memory device of the related art.
Figure 6:
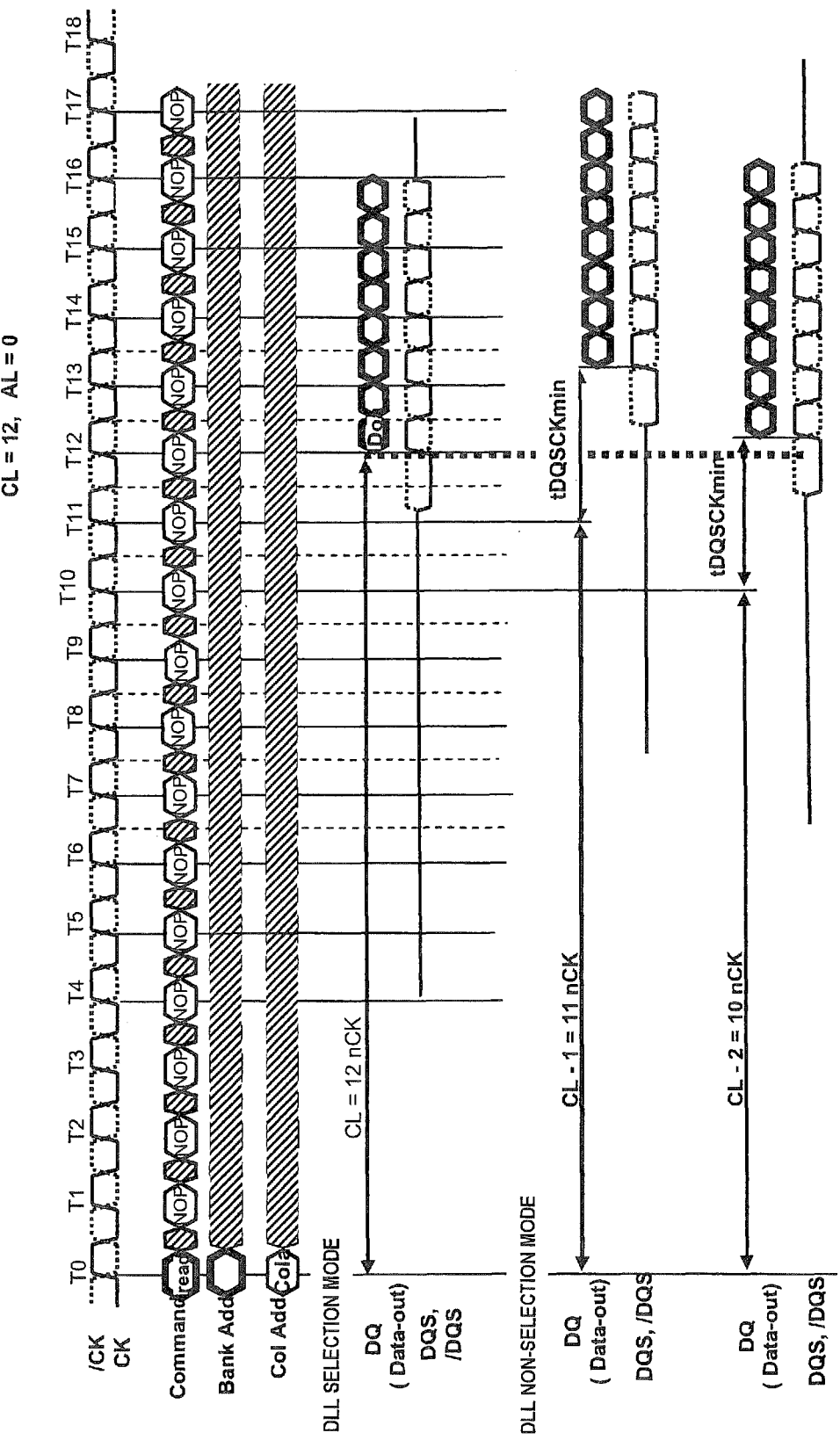
FIG. 6 is a timing diagram when a read command is executed in the semiconductor memory device in the example of the present invention.

FIG. 6 is a timing diagram when the read command is executed in the semiconductor memory device in the example of the present invention. FIG. 6 shows operation timings of the DLL selection mode and the DLL non-selection mode. The CAS latency specifying register 62 sets the CAS latency to 12 clocks. Accordingly, an operation timing in the DLL selection mode is the same as in a timing diagram shown in FIG. 2 when the CAS latency is set to 12 in a DLL-on mode of a DDR3 SDRAM. The DLL non-selection mode in FIG. 6 shows a case where edges that precede a read operation starting edge in the DLL selection mode by −1 and −2 cycles have been selected by the reference edge specifying register 63, as reference edges. When an edge that precedes the read operation starting edge by −1 cycle is selected by the reference edge specifying register, an operation timing is the same as in an operation shown in FIG. 2, where the CAS latency is set to 12 in a DLL-off mode of the DDR3 SDRAM. In this case, the output timing of read data is greatly delayed from an output start timing in the DLL selection mode at the shortest, as described in FIG. 2.

On the other hand, when an edge that precedes the read operation starting edge by −2 cycles is selected by the reference edge specifying register 63 as a reference edge, data output can be started at a timing close to that in the DLL selection mode, at the shortest.

The example mentioned above shows the case where the edge that precedes the read operation starting edge is selected for each cycle by setting of the reference edge specifying register. Edge selection for each half cycle can also be readily made. Further, when the configuration of the read latency counter 61 is modified, edge selection for each quarter cycle can also be made. However, in this example, no change is made on the value of the CAS latency specifying register between the DLL selection mode and the DLL non-selection mode. Thus, dynamic switching between the DLL selection mode and the DLL non-selection mode can also be made if read data is not being output. When the memory system of the present invention is used for a laptop PC or the like, for example, the memory system can be operated in the DLL non-selection mode when operated by a battery. Then, when switching to an AC power source is made, switching from the DLL non-selection mode to the DLL selection mode can also be made, without suspending operation. Further, when the DLL is switched on from off, operation including reception of the read command can be continued in the DLL non-selection mode until the DLL is locked. Then, switching to the DLL selection mode can also be made after the DLL has been locked.

Further, a variation in a read data output starting timing greatly depends on a variation in the semiconductor memory devices, in the DLL non-selection mode. When the memory controller regularly changes the set value of the reference edge specifying register to carry out a read test of the semiconductor memory devices and then optimizes the set value of the reference edge specifying register, a memory system having the read access time tAA that does not depend on temperature, power supply voltage, and manufacturing variation of the semiconductor memory devices can be constructed.

The description in the above-mentioned example is made, using the semiconductor memory device as the example. As described above, the present invention is not limited to the semiconductor memory device, and can be extensively applied to a semiconductor device including a source synchronous transfer circuit in which a command (request) is supplied in synchronization with a system clock from an outside, a transfer clock is output in response to the command (request), and data is output in synchronization with the transfer clock.

In the present invention, there are various possible modes, which includes:
(Mode 1)
  as set forth as the first aspect.

(Mode 2)

The semiconductor memory device according to mode 1, wherein said synchronous circuit is a DLL circuit or a PLL circuit.

(Mode 3)

The semiconductor memory device according to mode 1 or 2, wherein the read data is output, in synchronization with a read data strobe signal, and the read data strobe signal is output in synchronization with the system clock in said synchronous circuit selection mode and is output in synchronization with the internal clock in said synchronous circuit non-selection mode.

(Mode 4)

The semiconductor memory device according to any one of modes 1 through 3, wherein said synchronous circuit is stopped in said synchronous circuit non-selection mode.

(Mode 5)

The semiconductor memory device according to any one of modes 1 through 4, further comprising:

a CAS latency specifying register that specifies a number of clocks of the system clock from reception of a read command to start of output of the read data in said synchronous circuit selection mode;

a timing of starting output of the read data after reception of the read command being specified by a combination of the number of clocks specified by said CAS latency specifying register and said edge of the internal clock that serves as the reference, specified by said reference edge specifying register, in said synchronous circuit non-selection mode.

(Mode 6)

The semiconductor memory device according to mode 5, comprising:

a read latency counter that counts a number of clocks after the read command has been received;

a decoder circuit that decodes an output signal of said CAS latency specifying register and an output signal of said reference edge specifying register and specifies a number of clocks of the internal clock until output of the read data is started; and a selection circuit that selects and outputs, from among timing signals output by said read latency counter, a timing signal indicating the number of clocks specified by said decoder circuit, as a read data output starting signal.

(Mode 7)

as set forth as the second aspect.

(Mode 8)

The read wait time adjustment method according to mode 7, wherein the read data is output in synchronization with a read strobe signal and the read data is output by adjusting a timing of the read data strobe signal so that the phase delay is canceled.

(Mode 9)

as set forth as the third aspect.

(Mode 10)

The read wait time adjustment method of a semiconductor memory device according to any one of modes 7 through 9, wherein said synchronous circuit is a DLL circuit or a PLL circuit.

(Mode 11)

as set forth as the fourth aspect.

(Mode 12)

The memory system according to mode 11, wherein said synchronous circuit is a DLL circuit or a PLL circuit.

(Mode 13)

The memory system according to mode 11 or 12, wherein the semiconductor memory device further comprises:

a CAS latency specifying register that specifies a number of clocks of the system clock from reception of a read command to start of output of the read data in said synchronous circuit selection mode; and the larger the number of clocks set in the CAS latency specifying register by said memory controller is, the edge that occurs much earlier than an edge used for starting output of the read data in said synchronous circuit selection mode is specified by said reference edge specifying register.

(Mode 14)

as set forth as the fifth aspect.

(Mode 15)

The semiconductor device according to mode 14, wherein said synchronous circuit is a DLL circuit or a PLL circuit.

(Mode 16)

The semiconductor device according to mode 14 or 15, wherein a number of clocks of the system clock from reception of the command to output of the data by said source synchronous data transfer circuit is determined in advance in said synchronous circuit selection mode; and said edge of the internal clock is specified by said reference edge specifying register so that a phase delay of the internal clock with respect to the system clock is compensated for in said synchronous circuit non-selection mode.

(Mode 17)

The semiconductor device according to any one of modes 14 through 16, further comprising:

a latency specifying register that specifies a number of clocks of the system clock from reception of the command to output of the data by the source synchronous data transfer circuit in said synchronous circuit selection mode;

said source synchronous data transfer circuit starting data transfer based on a combination of the number of clocks specified by said latency specifying register and said edge specified by said reference edge specifying register in said synchronous circuit non-selection mode.

(Mode 18)

The semiconductor device according to mode 17, comprising:

a latency counter that counts a number of clocks after reception of the command; a decoder circuit that decodes an output signal of said latency specifying register and an output signal of said reference edge specifying register and specifies a number of clocks of the internal clock until said source synchronous transfer circuit starts the data transfer; and a selection circuit that selects and outputs, from among timing signals output by said latency counter, a timing signal indicating the number of clocks specified by said decoder circuit, as a data transfer starting signal.

(Mode 19)

The semiconductor device according to any one of modes 14 through 18, wherein said synchronous circuit is stopped in said synchronous circuit non-selection mode.

(Mode 20)

A read wait time adjustment method of a semiconductor memory device including a synchronous circuit, the method comprising:

selecting a synchronous circuit non-selection mode from modes of said semiconductor memory device, wherein said modes includes a synchronous circuit selection mode and said synchronous circuit non-selection mode, wherein read data from said semiconductor memory device is output by adjusting a phase of the read data with respect to a system clock by said synchronous circuit in said synchronous circuit selection mode, and wherein an operation of said synchronous circuit is stopped and the read data is output without using said synchronous circuit in said synchronous circuit non-selection mode, and setting a reference edge specifying register to cancel a phase delay of the read data with respect to the system clock, in view of a frequency of the system clock and the phase delay of the read data, wherein said reference specifying register is a register of said semiconductor memory device and specifies an edge of an internal clock serving as a reference for outputting the read data.

The above description was given in connection with the example of the present invention. The present invention, is not, however, limited to the configuration of the above-mentioned example alone, and of course includes various variations and modifications that could be made by those skilled in the art within the scope of the present invention.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A controller comprising:
a set of first terminals to be coupled to a device that is under control of the controller; and
a control circuit configured to generate and output onto the set of first terminals edge specifying information that takes a selected one of first and second states, the edge specifying information being supplied to the device to cause the device to activate a data strobe signal at a first timing when the selected one of the edge specifying information is the first state and at a second timing, that is different from the first timing, when the edge specifying information is the second state,
the control circuit being further configured to generate and output onto the set of first terminals a read command, the read command being supplied to the device to cause the device to return to the controller a data signal while activating the data strobe signal at one of the first and second timings that is designated by the selected one of the states of the edge specifying information.

2. The controller as claimed in claim 1, further comprising second and third terminals to be coupled to the device, the second terminal receiving the data signal, the third terminal receiving the data strobe signal, and the controller being configured to fetch the data signal in response to the data strobe signal.

3. The controller as claimed in claim 2, further comprising a fourth terminal to be coupled to the device, the control circuit being configured to generate and output a system clock signal onto the fourth terminal to cause the device to activate the data strobe signal in response to the system clock.

4. The controller as claimed in claim 1, wherein the control circuit is further configured to generate and output onto the first set of first terminals synchronous mode information that takes a selected one of first and second modes, the synchronous mode information being supplied to the device to cause the device to activate the data strobe signal that is synchronous in phase with a system clock when the selected one of the synchronous mode information is the first mode and is asynchronous in phase with the system clock when the selected one of the synchronous mode information is the second mode.

5. The controller as claimed in claim 4, further comprising a second terminal to be coupled to the device, the control circuit being configured to generate and output the system clock signal onto the second terminal to supply the device with the system clock.

6. The controller as claimed in claim 4, further comprising third and fourth terminals to be coupled to the device, the third terminal receiving the data signal, the fourth terminal receiving the data strobe signal, and the controller being configured to fetch the data signal in response to the data strobe signal.

7. A controller comprising:
a set of first terminals to be coupled to a device that is under control of the controller; and
a control circuit configured:
to communicate the device through the set of first terminals to carry out a read test on the device,
to generate and output, in response to a result of the read test, onto the set of first terminals edge specifying information that takes a selected one of a plurality of states, the edge specifying information causing the device to activate a data strobe signal at a first timing when the selected one of the edge specifying information is a first state and at a second timing, that is different from the first timing, when the selected one of the edge specifying information is a second state; and
to generate and output onto the set of first terminals a read command that causes the device to return to the controller a data signal while activating the data strobe signal at one of the first and second timings that is designated by the selected one of the states of the edge specifying information.

8. The controller as claimed in claim 7, further comprising second and third terminals to be coupled to the device, the second terminal receiving the data signal, the third terminal receiving the data strobe signal, and the controller being configured to fetch the data signal in response to the data strobe signal.

9. The controller as claimed in claim 8, wherein the control circuit is further configured to generate and output onto the set of first terminals synchronous mode information that takes a selected one of first and second modes, the synchronous mode information causing the device to activate the data strobe signal that is synchronous in phase with a system clock when the selected one of the synchronous mode information is the first mode and is asynchronous in phase with the system clock when the selected one of the synchronous mode information is the second mode.

10. The controller as claimed in claim 9, further comprising a fourth terminal to be coupled to the device, the control circuit being configured to generate and output the system clock signal onto the fourth terminal to supply the device with the system clock.

11. A method comprising:
carrying out a read test on a semiconductor memory device to be controlled;
producing, in response to a result of the read test, edge specifying information that takes a selected one of a plurality of states, a first one of the states of the information instructing the semiconductor memory device to commence activation of a strobe signal at a first timing, and a second one of the states of the information instructing the semiconductor memory device to commence activation of the strobe signal at a second timing that is different from the first timing; and
issuing a data read command that instructs the semiconductor memory device to return a data signal while commencing activation of the data strobe signal at one of the first and second timings that is designated by the selected one of the states of the edge specifying information.

12. The method as claimed in claim 11, further comprising: fetching the data signal in response to the data strobe signal.

13. The method as claimed in claim 12, wherein the strobe signal is fixed temporarily at a first logic level by commencing activation of the data strobe signal and then changed between the first logic level and a second logic level.

14. The method as claimed in claim 13, wherein the data signal is generated in synchronism with the data strobe signal changing between the first and second logic levels.

15. The method as claimed in claim 14, further comprising producing latency information to the semiconductor memory device, the latency information designating a period of time between issuance of the data read command and generation of the data signal.

16. The method as claimed in claim 12, further comprising: producing synchronous mode information that takes a selected one of first and second modes, the first mode of the synchronous mode information instructing the semiconductor memory device to activate the data strobe signal that is synchronous in phase with a system clock and the second mode of the synchronous mode information instructing the semiconductor memory device to activate the data strobe signal that is asynchronous in phase with the system clock.

17. The method as claimed in claim 12, further comprising: producing synchronous mode information that takes a selected one of first and second modes, the first mode of the synchronous mode information instructing the semiconductor memory device to turn ON a DLL circuit that is incorporated into the semiconductor memory device, and the second mode of the synchronous mode information instructing the semiconductor memory device to turn OFF the DLL circuit.

* * * * *